US007761766B2

(12) United States Patent
Boldt et al.

(10) Patent No.: US 7,761,766 B2
(45) Date of Patent: Jul. 20, 2010

(54) METHODS AND APPARATUS FOR MODIFYING A BACKUP DATA STREAM INCLUDING LOGICAL PARTITIONS OF DATA BLOCKS TO BE PROVIDED TO A FIXED POSITION DELTA REDUCTION BACKUP APPLICATION

(75) Inventors: Timothy J. Boldt, Mississauga (CA); Andre G. Lewitzky, Waterdown (CA); Nikolay K. Stoilov, Toronto (CA)

(73) Assignee: i365 Inc., Santa Clara, CA (US)

( * ) Notice: Subject to any disclaimer, the term of this patent is extended or adjusted under 35 U.S.C. 154(b) by 1258 days.

(21) Appl. No.: 11/280,545

(22) Filed: Nov. 15, 2005

(65) Prior Publication Data

US 2007/0220222 A1 Sep. 20, 2007

(51) Int. Cl.
*H04L 1/00* (2006.01)

(52) U.S. Cl. .............. 714/747; 701/201; 701/202; 701/204; 701/205

(58) Field of Classification Search .............. 714/747; 711/162; 707/201–205
See application file for complete search history.

(56) References Cited

U.S. PATENT DOCUMENTS

| 5,745,906 | A | 4/1998 | Squibb | |
|---|---|---|---|---|
| 5,752,039 | A | 5/1998 | Tanimura | |
| 5,978,814 | A * | 11/1999 | Miller et al. | 707/203 |
| 5,990,810 | A | 11/1999 | Williams | |
| 6,671,703 | B2 * | 12/2003 | Thompson et al. | 707/202 |
| 7,281,023 | B2 * | 10/2007 | Lou | 707/200 |
| 7,406,575 | B2 * | 7/2008 | Lam et al. | 711/161 |
| 7,472,254 | B2 * | 12/2008 | Collins | 711/220 |

OTHER PUBLICATIONS

International Search Report and Written Opinion dated Sep. 7, 2007 from corresponding PCT Application No. PCT/US2006/044114.
R.C. Burns et al., "In-Place Reconstruction of Delta Compressed Files," Proceedings of the 17th Annual ACM Symposium on Principles of Distributed Computing. PODC 1998 Puerto Vallarta, Mexico, Jun. 28-Jul. 2, 1998, ACM Sigact Sigmod Symposium on Principles of Distributed Computing New York, NY: ACM, US, Jul. 1998, pp. 267-275, XP002324856.

(Continued)

*Primary Examiner*—Sam Rizk
(74) *Attorney, Agent, or Firm*—Weaver Austin Villeneuve & Sampson LLP

(57) ABSTRACT

When a data stream is received, the data stream may be parsed into a plurality of logical components, where each of the logical components includes one or more data blocks. Missing data blocks may also be detected in the data stream, and therefore may be detected in each of the plurality of logical components. For instance, each of the logical components may be separated into a separate data stream for which missing data blocks may be detected. A temporary data block is then inserted where each missing data block is detected (e.g., in each of the plurality of logical components). In this manner, inefficiencies introduced into a fixed position delta reduction backup process as a result of new or deleted data in a system implementing a plurality of data blocks which may be stored in the form of logical components are eliminated.

61 Claims, 11 Drawing Sheets

OTHER PUBLICATIONS

T. Schwarz et al., "Low Comparisons of File Copies," Proceedings of the International Conference on Distributed Computing Systems. Paris, May 28-Jun. 1, 1990, Los Alamitos, IEEE Comp. Soc. Press, US, vol. CONF. 10, May 28, 1990 pp. 196-202, XP010019310.

Torsten Suel and Nasir Memon, "Algorithms for Delta Compression and Remote File Synchronization," CIS Department Technical Report Polytechnic University Brooklyn, [Online] 2002, pp. 1-24, XP002448124.

* cited by examiner

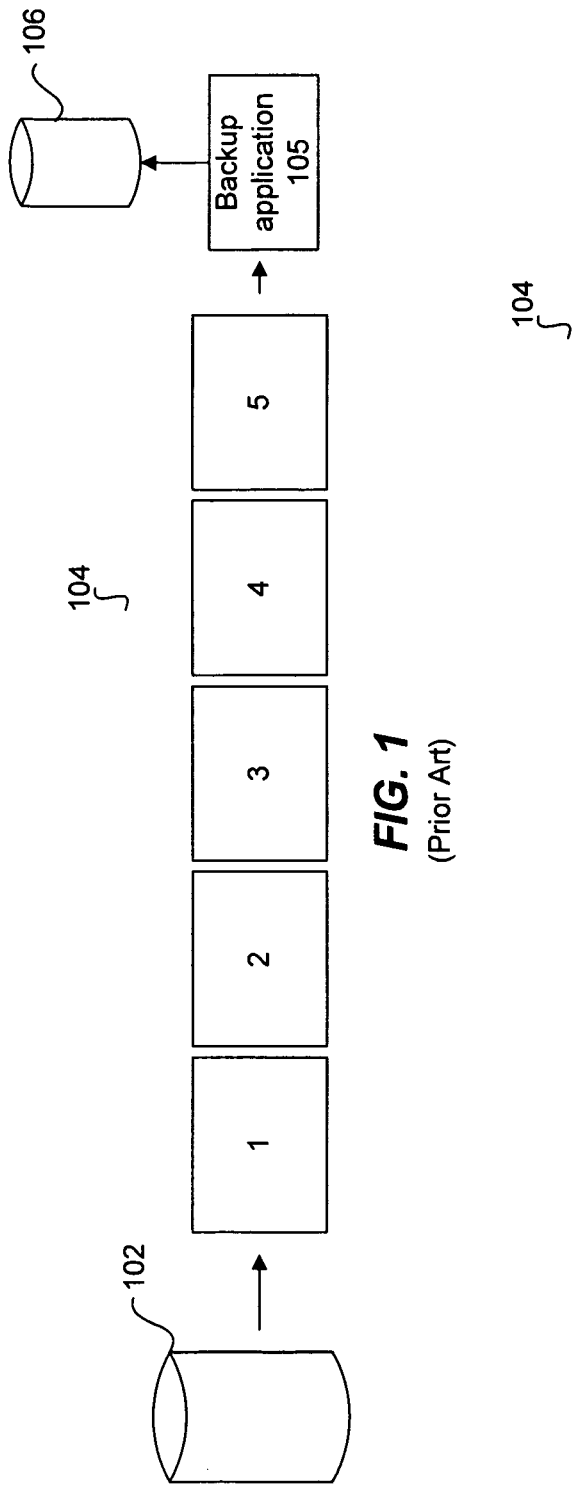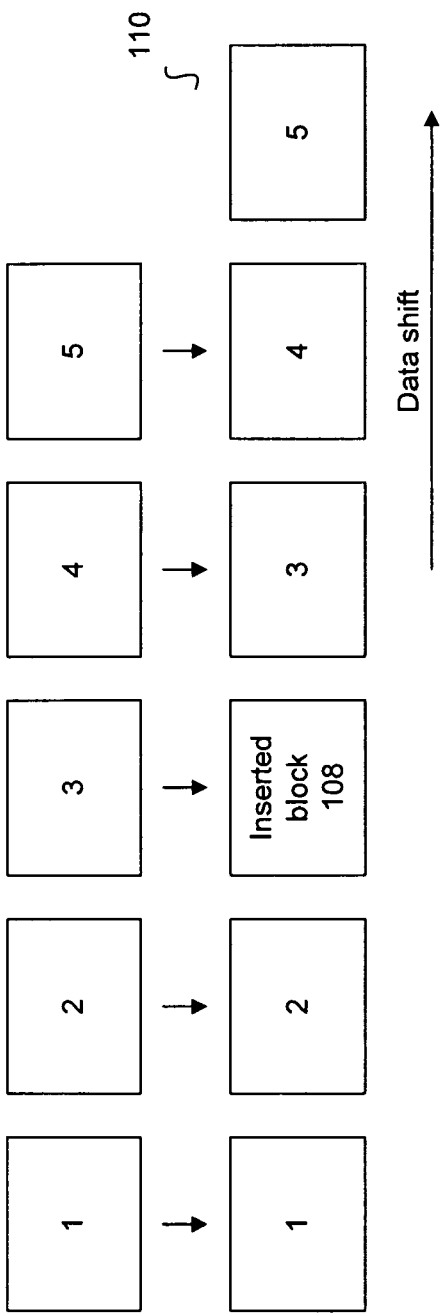
FIG. 1
(Prior Art)
FIG. 2
(Prior Art)

| Information type 710 | Metadata (e.g., file name, length of data) 712 |
|---|---|

| Logical component 1104 | Data blocks encountered during backup 1106 |
|---|---|
| 1 | 1,2,3,4,5,6,7 |
| 2 | 1,3,4,5 |
| n | 1..... |

| Header indicating data block is temorary (data block can be removed upon restore) 1204 | Null data block 1206 |
|---|---|

METHODS AND APPARATUS FOR MODIFYING A BACKUP DATA STREAM INCLUDING LOGICAL PARTITIONS OF DATA BLOCKS TO BE PROVIDED TO A FIXED POSITION DELTA REDUCTION BACKUP APPLICATION

BACKGROUND OF THE INVENTION

The present invention relates to modifying a backup data stream to be processed by a fixed position delta reduction backup process. More particularly, the present invention relates to modifying a backup data stream to be processed by a fixed position delta reduction backup method, where the backup data stream includes concatenated logical partitions of data blocks.

In order to backup data, data backups are often performed via what is commonly referred to as a "backup application." In order to backup the data, the backup application sends the data to be stored either to a local storage medium or via a network interface for remote transmission. The amount of data that is stored by the backup application varies with the method implemented by the backup application. For instance, some backup applications backup all data in the specified directory, database or file, while other applications attempt to increase the efficiency of the backup process by storing only the data that has been modified since the last backup. One commonly used method is the fixed position delta reduction method, which determines which fixed position segments of data have been modified since the last backup and stores the data reflecting those changes. In other words, the fixed position delta reduction method determines which segments of data have been modified by comparing one segment of data at a fixed position in a file or data stream received during a current backup with the segment of data previously at that same fixed position in the file or data stream during the last backup for that particular file.

The process via which a backup application implementing a fixed position delta reduction method executes and the effectiveness of that process varies with the format in which data is stored. Specifically, data associated with a particular file or database may be retrieved in the form of separate physical-organized streams or in a single stream including a plurality of data segments (i.e., blocks), which may be formed by concatenated logical partitions of data blocks. In other words, each logical partition includes one or more data blocks. Unfortunately, there are a number of problems that are introduced into a backup application implementing a fixed position delta reduction backup method when data is added to or deleted from a system implementing a backup data stream including a plurality of data blocks, which may be formed by concatenating logical partitions of data blocks.

In order to illustrate the effectiveness of a fixed position delta reduction backup application for a system implementing a backup data stream including a plurality of data blocks, the operation of the fixed position delta reduction backup application will be described with reference to FIGS. 1-3. FIG. 1 is a diagram illustrating an exemplary data stream including a plurality of blocks of data. As shown in FIG. 1, backup data is typically sent to the backup application as a data stream. In this example, a database 102 transmits the data stream 104 to a fixed position delta reduction backup application 105 for storing to a storage medium 106. As shown, the data stream 104 includes data blocks 1, 2, 3, 4, 5.

New data added to a file or database implementing a plurality of data blocks typically requires that a new data block be allocated. This new data block will appear as an insertion of a data block in the data stream provided to the fixed position delta reduction backup application, resulting an a "shift" in all subsequent data blocks in the data stream. As shown in FIG. 2, the insertion of data block "Inserted block" 108 between data blocks 2 and 3 results in a shift of the subsequent data blocks 3, 4, and 5 from their position in the original data stream 104, creating a modified data stream 110. As a result, when each data block in the modified data stream 110 is compared to the corresponding data block of the original data stream 104 (represented by corresponding arrows), the data blocks subsequent to the inserted data block 108 appear to have been modified or to be new data. Specifically, in this example, the blocks 3, 4, and 5 of the modified data stream 110 are compared to the corresponding data blocks 4, 5, and a non-existent data block in the original data stream 104, respectively, resulting in the storing of the data blocks 3, 4, and 5, as well as the inserted block 108. In other words, the "shifting" causes a backup application implementing a fixed position delta reduction method to recognize all subsequent data following the inserted data block as new (or modified) data. Thus, for data streams including a plurality of concatenated logical components, data in the logical components following the inserted data block will be perceived as new (or modified) data. As a result, the detection of this "new data" requires that all of the "new data" be written to a local storage medium or transmitted via a network interface for storing to a remote storage medium in order to perform a complete backup. Accordingly, this "new data" is stored unnecessarily, resulting in an inefficient processing of backup data provided to the fixed position delta reduction backup application.

Similarly, when data is deleted from a file or database implementing a plurality of data blocks, a data block is either deleted or de-allocated (e.g., marked as unused). When this data block is removed from the data stream, this causes a shift in the data blocks in the data stream in the opposite direction shown in FIG. 2. As shown in FIG. 3, the removal of data block "3" indicated at 112 of the modified data stream 114 results in a shift of data blocks from their position in the original data stream 104, as shown. As a result, this "shifting" causes a fixed position delta reduction backup application to recognize all data following the deleted data block to be new data. In this example, blocks 4 and 5 follow the deleted data block 112, and are therefore recognized as new data (since the last backup). Thus, for data streams including a plurality of concatenated logical components, data in the logical components following the deleted data block will be perceived as new (or modified) data. This "new data" is then unnecessarily written or transmitted to local or remote storage, respectively, introducing inefficiencies into the fixed position delta reduction backup process.

The inefficiencies introduced into the fixed position delta reduction backup process for systems implementing a backup data stream including a plurality of data blocks may go unnoticed for a single file that has been edited, resulting in the storing or re-transmission of a larger portion of the file than necessary. However, for a database application backing up a large number of files in the database, the amount of data that is stored or re-transmitted by a fixed position delta reduction backup application could be significant. As a result, these undesirable insertion and deletion characteristics could have a significant impact on the time in which a fixed position delta reduction backup application completes for a single data backup session in a system implementing data transmitted in the form of a stream including a plurality of data blocks, as well as a system implementing data transmitted in the form of a stream including logical partitions of data blocks. Since many common database programs such as Microsoft's SQL Server™ provide data during data backup in the form of a stream including a plurality of data blocks, as well as in the form of a stream including concatenated logical partitions, this is particularly problematic.

A number of fixed position delta reduction methods have been developed for use in backup applications. Those fixed position delta reduction methods that have been developed for use with systems implementing fixed length data blocks include those described in U.S. Pat. No. 5,990,810, entitled "Method for partitioning a block of data into subblocks and for storing and communicating such subblocks," issued Nov. 23, 1999 to Ross Williams and in U.S. Pat. No. 5,745,906, entitled "Method and apparatus for merging delta streams to reconstruct a computer file," issued Apr. 28, 1998 to Mark Squibb, both of which are incorporated herein by reference. However, none of the existing methods are effective in reducing the inefficiencies resulting from the insertion and deletion characteristics set forth above.

In view of the above, it would be beneficial if the inefficiencies introduced into a fixed position delta reduction backup process as a result of new or deleted data in a system implementing a backup data stream including a plurality of data blocks and/or concatenated logical partitions of data blocks could be eliminated.

SUMMARY OF THE INVENTION

The disclosed embodiments eliminate the inefficiencies introduced into a fixed position delta reduction backup process as a result of new or deleted data in a system implementing data blocks and/or logical partitions of data blocks. This is accomplished, in part, by modifying a stream of backup data prior to processing the backup data stream via a fixed position delta reduction backup method. By modifying the stream of backup data, the amount of data that is detected by the fixed position delta reduction backup method as new or changed is minimized. Accordingly, the amount of data that is stored by the fixed position delta reduction backup method to complete a data backup is substantially reduced.

In the following description, the disclosed embodiments are described with reference to a fixed position delta reduction backup application. More specifically, a backup data stream is modified prior to providing one or more modified backup data streams to the fixed position delta reduction backup application. However, it is important to note that the disclosed embodiments may also be implemented by the fixed position delta reduction backup application. In other words, since the disclosed embodiments and the fixed position delta reduction backup process may be implemented by a single application, the modified data stream may be processed by the corresponding fixed position delta reduction backup method without requiring that the modified data stream(s) be provided to a separate application. Accordingly, the terms "fixed position delta reduction backup application" and "fixed position delta reduction backup method" may be used interchangeably.

In order to minimize the data that is detected by a fixed position delta reduction backup application as new or modified data, a delta method modifies a stream of backup data to be provided to a fixed position delta reduction backup application. In accordance with one embodiment, the delta method may perform one or both of two different operations on the stream of backup data. These two operations include 1) the separation of logical components in the stream of backup data and 2) the insertion of temporary data blocks for detected missing data blocks in the stream of backup data. A data block that is "missing" from a data stream is a data block that has been assigned a sequential identifier for a file or database, but is not present in the current data stream transmitted during the current data backup. For instance, the data block may be a data block that has been previously recorded for the associated file or database during a prior data backup, but is not present in the current data stream transmitted during the current data backup. Both of these operations may be performed on the backup data sequentially to generate at least one modified data stream. Alternatively, each of these operations may be performed individually on the backup data.

In accordance one aspect of the invention, a backup data stream is separated into logical components. Specifically, a backup data stream is parsed into a plurality of logical components. A logical component may be a logically distinct portion of a file or database. Each logical component includes one or more data blocks. In accordance with one embodiment, each of the data blocks is a fixed length data block. In other words, the length of a fixed length data block is a specific, predetermined length. The length may be fixed with respect to position (e.g., with respect to other data blocks), as well as with respect to time. Stated another way, the length is fixed with respect to position when each of the fixed length data blocks includes a predetermined, identical number of bytes of data. The length is fixed with respect to time when the length of a data block remains the same across time, and therefore across multiple data backups. Since a logical component may include any number of data blocks (fixed length or otherwise), the length of a logical component is variable.

In accordance with one embodiment, when a backup data stream is parsed into logical components, the data stream is parsed into a plurality of data streams, where each of the data streams corresponds to a different logical component, thereby modifying the original backup data stream. These separate data streams may then be provided separately to a fixed position delta reduction backup application. In certain embodiments, each of these separate data streams may be processed to insert temporary data blocks where missing data blocks are detected in the data stream prior to providing the separate data streams to the fixed position delta reduction backup application. Since the logical components in the backup data stream are separated, there will be no "shift" of logical components (and therefore the data blocks included in those logical components) that would otherwise be processed subsequent to the logical component in which a data block has been inserted. In other words, the fixed position delta reduction process treats each logical component as a new data stream, rather than a concatenated group of logical components. As a result, the data change detected by a fixed position delta reduction backup application is reduced, resulting in a reduction in the amount of data that is stored by the fixed position delta reduction backup application to complete a data backup.

In accordance with another aspect of the invention, temporary data blocks are inserted where missing data blocks have been detected in a data stream. This may be accomplished by detecting missing data blocks for each of the logical components in the data stream. A temporary data block is then inserted for each missing data block that has been detected in each of the logical components, thereby generating one or more modified data streams. These modified data streams may then be provided to a fixed position delta reduction backup application. In this manner, data is properly "aligned" prior to providing the data to the fixed position delta reduction backup application. Since the detectable data change since the last data backup performed for that file or database is minimized, the data that is stored by the fixed position delta reduction backup application to complete the data backup is also minimized.

In accordance with one embodiment, a temporary data block is a data block that includes a header indicating that the temporary data block may be removed upon restore of a file that has been stored by a fixed position delta reduction backup application. Where the data blocks in the data stream are fixed length data blocks, the temporary data block may also be the same length as the other fixed length data blocks in the data stream. The temporary data block may include null bytes or other content.

In accordance with another embodiment, missing data blocks may be detected by identifying the data blocks in the data stream and determining which data blocks are missing from the identified data blocks. For instance, each data block may include a sequential indicator that may be used to identify the data block, as well as ascertain its order within the set of data blocks for that logical component. By identifying the sequential indicators that are present in the data stream, it is possible to conclude that those sequential indicators that are missing from the sequence identify those data blocks that are missing. It is also possible to compare the identified data blocks with those data blocks that were previously encountered for that same logical component during a previous backup. In this manner, it is possible to identify those data blocks that were assigned a sequential indicator, but are now missing from that logical component.

In accordance with one embodiment, each of the data blocks is a fixed length with respect to the position of the data block, as well as with respect to time across multiple backups. However, it is important to note that the data blocks may be fixed length only with respect to position or with respect to time. Moreover, the data blocks may also be of variable length with respect to position and/or with respect to time.

In accordance with yet another embodiment, the delta method is applied to a backup data stream received from a SQL Server™ database, which is made up of one or more files. Each file includes one or more logical components, each of which includes one or more fixed length data blocks, termed "extents." Each extent includes a group of eight continuous pages. Since each page in a SQL Server™ holds 8K, each extent is 64K in size. Each page of an extent includes a page number that may be used as a sequential indicator for use in detecting missing extents.

In accordance with another aspect of the invention, the invention pertains to a system operable to perform and/or initiate any of the disclosed methods. The system includes one or more processors and one or more memories. At least one of the memories and processors are adapted to provide at least some of the above described method operations. In yet a further embodiment, the invention pertains to a computer program product for performing the disclosed methods. The computer program product has at least one tangible computer readable medium and computer program instructions associated with at least one of the computer readable product configured to perform at least some of the above described method operations.

These and other features and advantages of the present invention will be presented in more detail in the following specification of the invention and the accompanying figures, which illustrate by way of example the principles of the invention.

BRIEF DESCRIPTION OF THE DRAWINGS

FIG. 1 is a diagram illustrating an exemplary data stream including a plurality of data blocks.

FIG. 2 is a diagram illustrating the result of inserting a data block into a data stream including a plurality of data blocks as shown in FIG. 1.

DETAILED DESCRIPTION OF SPECIFIC EMBODIMENTS

Figure 3:
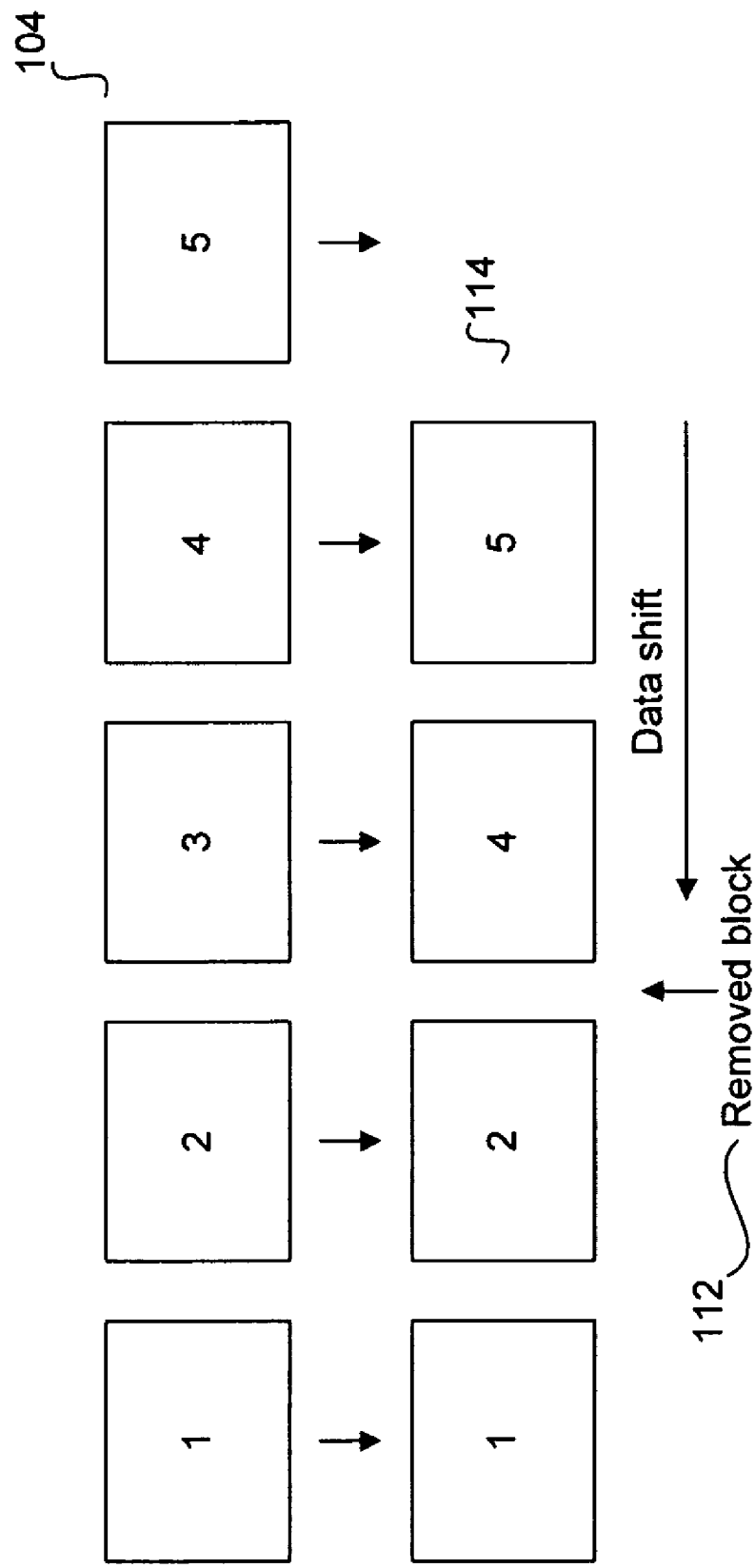
FIG. 3 is a diagram illustrating the result of deleting or de-allocating a data block from a data stream including a plurality of data blocks as shown in FIG. 1.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The disclosed embodiments enable a backup data stream that is received from a system implementing fixed length data blocks to be efficiently processed by a fixed position delta reduction backup method. This is accomplished, in part, by modifying the backup data stream prior to passing it to the fixed position delta reduction backup method. By modifying the backup data stream, the amount of data that is perceived by the fixed position delta reduction backup method to be new or changed is minimized. In this manner, inefficiencies typically introduced into the fixed position delta reduction backup process when a data block is "inserted into" or "removed from" the backup data stream are eliminated.

The backup data stream may be modified in one or both of two different ways. First, the data stream may be modified to separate the data stream into logical components and therefore separate data streams. Second, a temporary data block may be inserted within a data stream where each missing data block is detected. Each of these operations may be performed individually on a backup data stream. Alternatively, both of these operations may be performed in combination on the same backup data stream.

Data associated with a particular file or database may be stored in variable length data blocks or fixed length data blocks. The length of a data block may vary or be fixed with respect to position (e.g., with respect to other data blocks) and/or time (e.g., over time).

A variable length data block for which the length varies with respect to time may be any length, which varies with the content of the data block. In other words, the length of a variable length data block for which the length varies over time may increase or decrease over time. When data is stored in variable length data blocks where the length varies with respect to position, each of the variable length data blocks may include any number of bytes of data. In other words, each data block may include a different number of bytes of data, and therefore the length of the data blocks need not be the same. A variable length data block for which the length varies with respect to position need not vary with respect to time, and vice versa.

The length of a fixed length data block is a specific, predetermined length. The length is fixed with respect to other data blocks when each of the fixed length data blocks includes a predetermined, identical number of bytes of data. The length is fixed with respect to time when the length of a data block remains the same across time, and therefore across multiple data backups. A fixed length data block for which the length is fixed with respect to position need not be fixed with respect to time, and vice versa. Many common database programs such as Microsoft's SQL Server™ divide databases into fixed length data blocks, where the length is fixed with respect to both position and time.

In the following description, a data block refers to a data block that is a fixed length, and therefore includes a predetermined number of bytes that is fixed across both position and time. One system that implements fixed length data blocks is the Microsoft SQL Server™. More particularly, the fixed length data block that is stored by the SQL Server™ is referred to as an "extent," which includes a group of eight continuous pages. Since each page in a SQL Server holds 8K, an extent is 64K in size. While the extent is one example of a fixed length data block, the disclosed embodiments may be applied to any system in which fixed length data blocks are implemented.

It is important to note that while the description refers to fixed length data blocks where the length of the data blocks is fixed with respect to position and time, the disclosed embodiments may be implemented with systems storing data in the form of variable length data blocks. In such systems, the length may vary with respect to position (e.g., with respect to other data blocks) and/or time (e.g., across multiple data backups). Moreover, the disclosed embodiments may also be implemented with systems storing data in the form of fixed length data blocks where the length is fixed with respect to only position or time.

In some embodiments, the backup data stream includes one or more logical components. In accordance with one embodiment, the backup data stream is received from a SQL Server™ database, which is made up of one or more files. Each file includes one or more logical components, each of which includes one or more fixed length data blocks, termed "extents."

The data that is provided to or obtained by a fixed position delta reduction backup application may be obtained from a database or file. In accordance with one embodiment, the data is obtained from a SQL Server™ database. Specifically, a SQL Server™ database is comprised of one or more files. Thus, when data from a SQL Server™ is transmitted or provided to a fixed position delta reduction backup application, the data is retrieved from a database, and therefore is retrieved from one or more files. Data from a SQL Server™ database is generally provided during a data backup via a "dump" in which the individual data files are provided one after the other.

Data associated with a file or database may be received by a backup application as one contiguous stream of data. For instance, the backup application may call an application programming interface (API) offered by a database engine to request backup data. In response, the database API will send the backup data as a stream to the requesting application.

Figure 4:
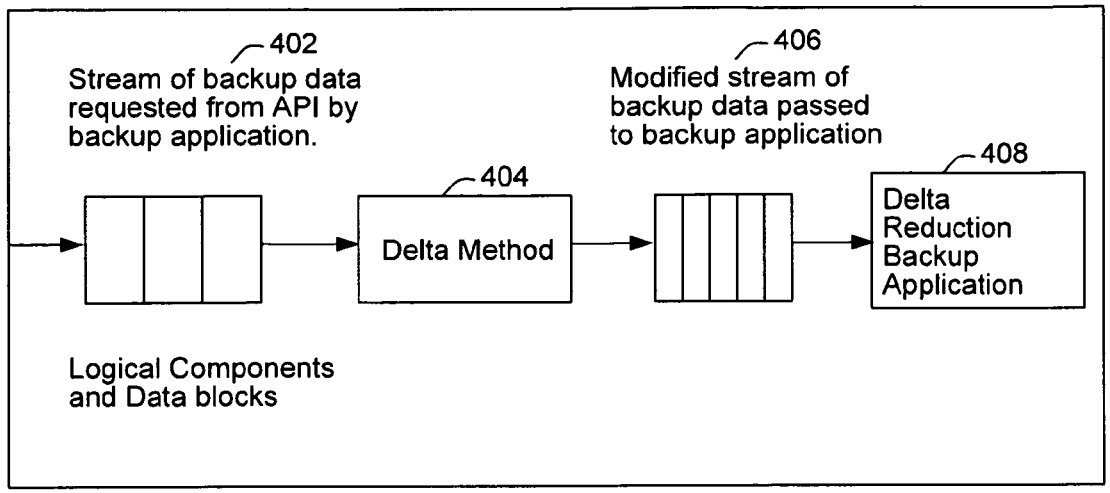
FIG. 4 is a diagram illustrating an exemplary system in which the present invention may be implemented.

FIG. 4 is a diagram illustrating an exemplary system in which the present invention may be implemented to modify a stream of backup data for transmission to a fixed position delta reduction backup application. As shown in FIG. 4, a stream of backup data 402 is received by a delta method 404. When the delta method 404 receives the stream of backup data, it modifies the stream of backup data, generating one or more modified data streams. Techniques for modifying the stream of backup data will be described in further detail below with reference to FIGS. 5-12. The modified data stream(s) 406 of backup data are then provided to a fixed position delta reduction backup application 408. Upon receipt of the modified data stream(s), the fixed position delta reduction backup application 408 processes the modified data stream(s) 406 according to standard fixed position delta reduction backup methods. It is important to note that in this example, the delta method 404 is performed separately from the fixed position delta reduction backup application 408. However, the delta method 404 and a fixed position delta reduction method may also be performed by a single application. Thus, a single application may implement any of the disclosed embodiments, as well as a fixed position delta reduction method and associated backup processes.

Each file or database, and therefore each stream of backup data 402 associated with a file or database, includes a plurality of logical components. A logical component may be defined as a logically distinct segment within a file or database, such as a backed-up file within a backup dump file or a database file/tablespace within a database dump stream. Each logical component includes one or more data blocks. As described above, the length of each of the data blocks is a fixed length. Since a logical component may include any number of fixed length data blocks, the logical components may vary in length.

Figure 5:
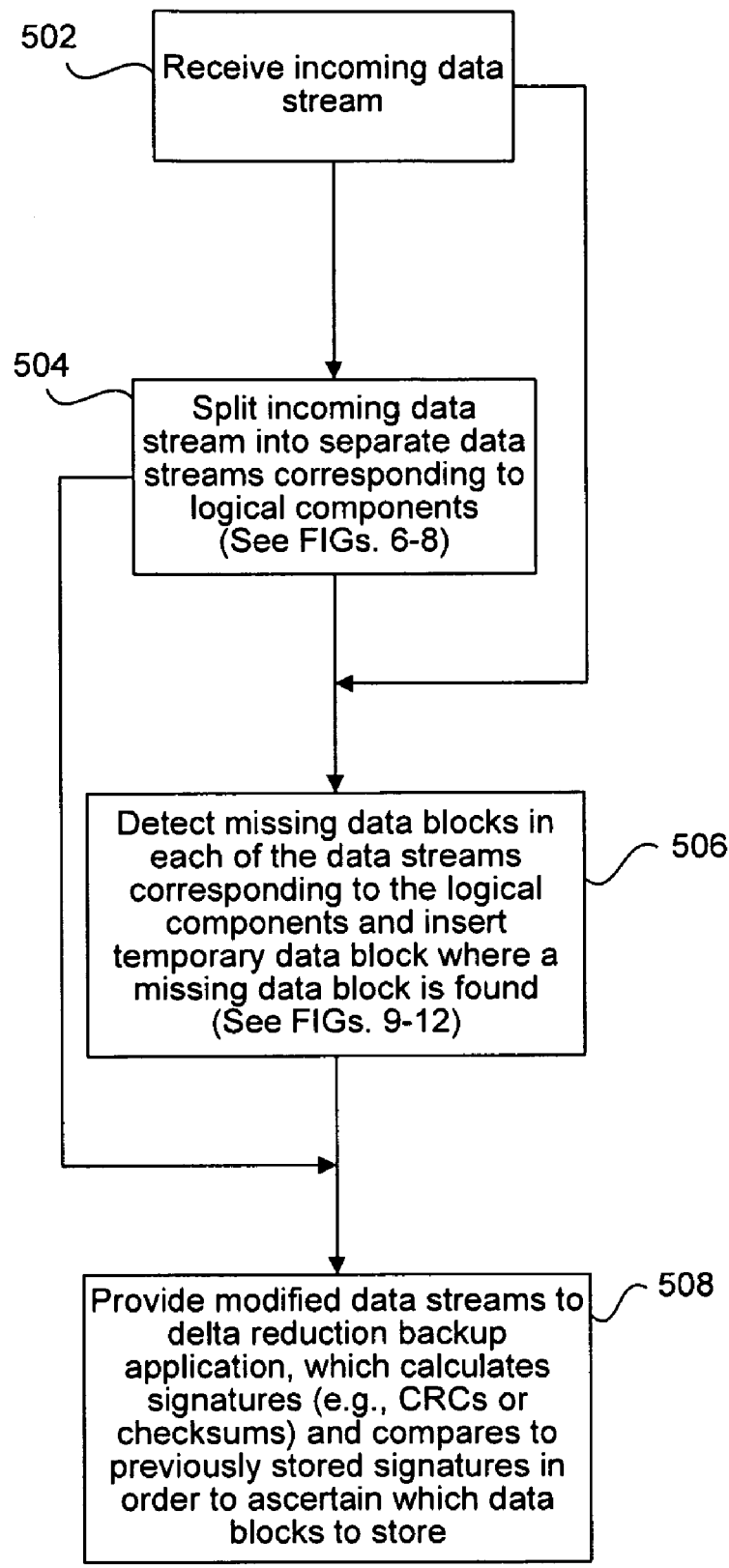
FIG. 5 is a process flow diagram illustrating a method of implementing a delta method as shown at block 404 of FIG. 4 in accordance with one embodiment of the invention.

FIG. 5 is a process flow diagram illustrating a method of implementing a delta method as shown at block 404 of FIG. 4 in accordance with one embodiment of the invention. When an incoming data stream is received at 502, the data stream may be processed by two different mechanisms, which may be implemented separately or in combination with one another, as shown by the three separate execution paths illustrated in FIG. 5. These two different mechanisms are described at blocks 504 and 506, which solve the insertion and deletion problems, respectively.

By parsing the data stream into logical components, it is possible to limit the number of logical components that are recognized as new or modified data by a fixed position delta reduction backup application. As shown at 504, the data stream may be parsed to separate the logical components of the data stream. In other words, the data stream is scanned to delineate the logical components in the data stream. For instance, the data stream may be parsed into separate data streams corresponding to the logical components identified in the data stream. Each separate logical component stream may then be provided separately to the fixed position delta reduction backup application, which treats it as a new stream unaffected by other logical component streams obtained from the database or other data source during the backup session.

One method for parsing the data stream into logical components will be described in further detail below with reference to FIGS. 6-8. Since an inserted data block only affects a single logical component of a file or database, the insertion will only affect the associated data stream. Thus, other logical components and associated alternate data streams will not be "shifted" as a result of an insertion of a data block in a single logical component. Accordingly, the negative impact resulting from the shifting of subsequent data blocks of a data stream following an inserted data block is reduced.

A data stream may also be "padded" where a data block has been deleted or de-allocated, eliminating the deletion problem described above. This padding may be performed for each logical component, and therefore each corresponding data stream. Specifically, as shown at 506, missing data blocks in each of the logical components (e.g., data streams corresponding to the logical components) are identified and a temporary data block is inserted where a missing data block is detected. One method for inserting "padding" for each missing data block will be described in further detail below with reference to FIGS. 9-12. The modified data stream(s) generated at step 504 and/or step 506 is then provided at 508 to a fixed position delta reduction backup application.

When the fixed position delta reduction backup application receives a modified data stream, the fixed position delta reduction backup application determines which data blocks to store to remote or local storage. For instance, the fixed position delta reduction backup application may determine which data blocks have been modified (e.g., changed, added, or deleted) by calculating signatures associated with the data blocks in the current modified data stream and comparing the calculated signatures to previously stored signatures associated with a previous backup of the same file or database. The fixed position delta reduction backup application also replaces the previously stored signatures with the newly calculated signatures, enabling the fixed position delta reduction backup application to detect changes made to the file or database since the most recent backup. A signature may be calculated, for example, by calculating a cyclic redundancy check (CRC) or checksum.

Once the fixed position delta reduction backup application determines which data has been modified since the last data backup, the fixed position delta reduction backup application stores the modified data. This data may be sent to a local data storage medium or may be sent via a network interface for transmission to a remote storage medium.

As described above with reference to block 504 of FIG. 5, a data stream may be parsed to separate the logical components of the data stream. The parsing of a data stream into logical components will be described in further detail below with reference to FIGS. 6-8.

Figure 6:
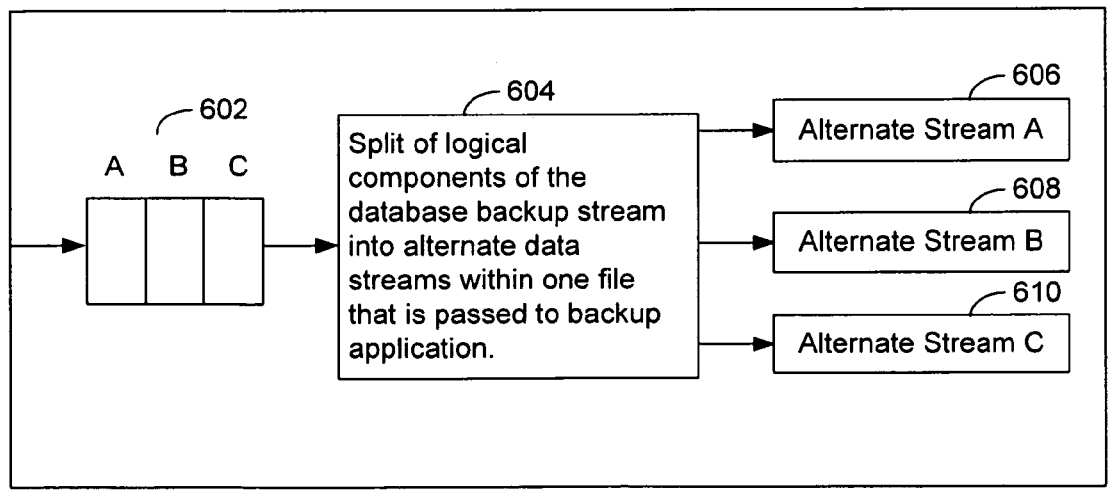
FIG. 6 is a block diagram illustrating an exemplary system in which an incoming backup data stream is split into separate data streams corresponding to logical components.

FIG. 6 is a block diagram illustrating an exemplary system in which an incoming backup data stream is split into separate data streams corresponding to logical components as described above with reference to block 504 of FIG. 5. As shown in FIG. 6, a data stream including a plurality of concatenated logical components is received at 602. The data stream is then parsed into a plurality of logical components at 604. As described above, each of the logical components includes one or more data blocks. In accordance with one embodiment, the data stream is split into a plurality of data streams 606, 608, 610, where each of the data streams corresponds to a different logical component. Each of the logical components and corresponding data streams 606, 608, 610 may then be provided to a fixed position delta reduction backup application. More specifically, the data streams 606, 608, 610 may be transmitted sequentially or in parallel (e.g., by a multi-threaded application) to a fixed position delta reduction backup application. Regardless, each logical component is treated as a separate and new data stream by the fixed position delta reduction backup application. Further, in certain embodiments, one or more of the logical components and corresponding data streams 606, 608, 610 may be further processed to insert "padding" blocks, as appropriate, as will be described in further detail below with reference to FIGS. 9-12.

Figure 7A:
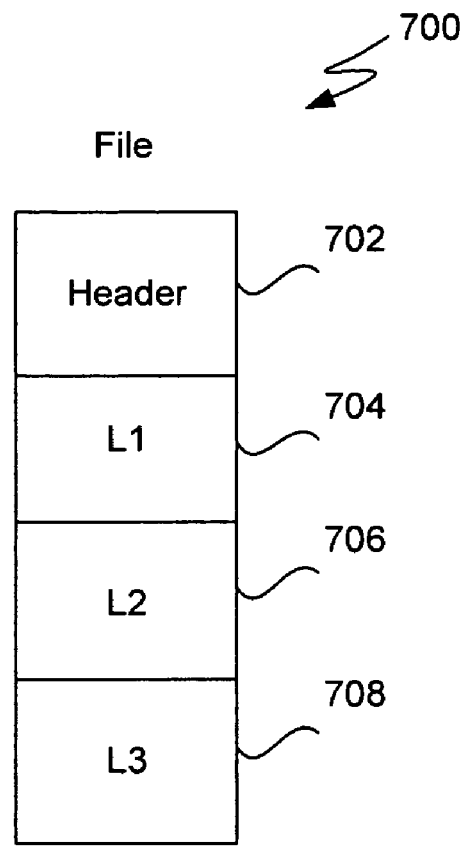
FIGS. 7A-B together represent an exemplary file that includes a plurality of logical components.

In order to illustrate a method of parsing a data stream corresponding to one or more files into logical components, an exemplary file will be described with reference to FIGS. 7A-B. This exemplary file represents a file retrieved from a SQL Server™. As shown in FIG. 7A, the file 700 includes a header 702 and one or more logical components 704, 706, 708. An exemplary header 702 will be described in further detail below with reference to FIG. 7B. The file 700 may include any number of logical components. For instance, the file 700 may include or be considered a single logical component. Alternatively, the file 700 may also include multiple, separate logical components within the file 700. In this example, the file 700 includes three logical components L1 704, L2 706, and L3 708. The logical components may be separated by analyzing the file data. For instance, by searching the pages of the file for page numbers, it is possible to identify those page numbers that are equal to a particular number (e.g., zero). More particularly, a page number equal to zero may indicate the start of a new logical component.

In other embodiments, each logical component may have an associated header indicating the start and end bytes of the logical component. For instance, the header may indicate the start of the logical component (e.g., implicitly or explicitly) and the length of the associated logical component, which may be used to calculate the end point for the logical component. Thus, each logical component header may be used to identify a demarcation point for use in separating the logical components.

A file header 702 such as that shown in FIG. 7A may include a variety of fields. For instance, FIG. 7B is a diagram illustrating an exemplary header 702. In this example, the file header 702 includes an information type field 710 and a metadata segment 712. The metadata segment 712 may include information such as a file name, length of the file data in bytes, etc. It is important to note that in the example set forth below with reference to FIG. 8, the term "logical component" refers to each file segment that includes data blocks of the file. However, the term "logical component" may also be used to refer to each segment of a file, where the segment may include metadata or other information about the data. For instance, a metadata segment of the file may be identified as a logical component that is separate from the file or data that follows the metadata segment.

Figure 7B:
Figure 8:
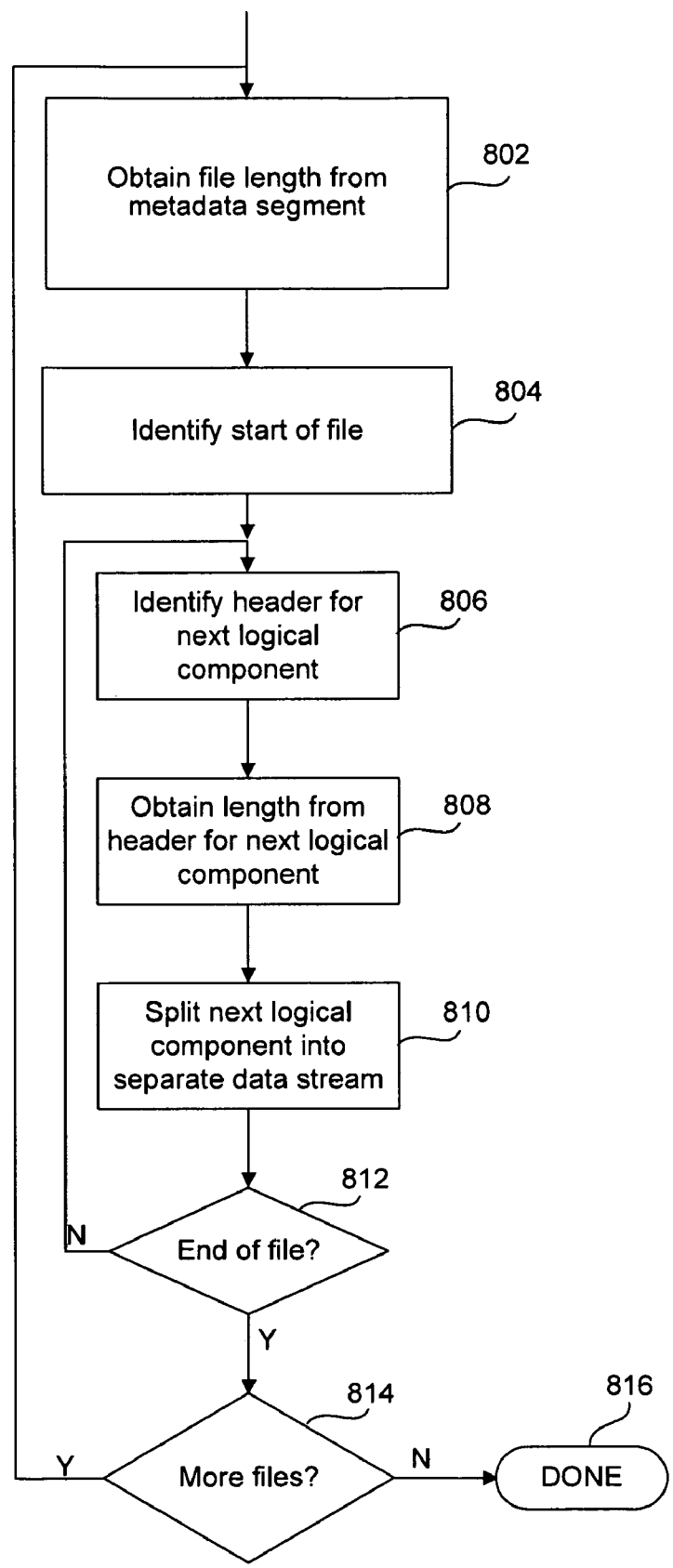
FIG. 8 is a process flow diagram illustrating a method of splitting a data stream including one or more files such as that illustrated in FIGS. 7A-C into separate data streams corresponding to logical components in accordance with one embodiment of the invention.

FIG. 8 is a process flow diagram illustrating a method of splitting a backup data stream including one or more files such as that illustrated in FIGS. 7A-B into separate data streams corresponding to logical components in accordance with one embodiment of the invention. As shown at 802, the file length may be obtained from the metadata segment associated with the file. The file length enables a parser to ascertain when an entire file has been parsed. Alternatively, an end of file marker may be used to identify the end of the file. It may also be desirable to identify the start of the file (e.g., which starts after the end of the header) at 804. For instance, the start of the file may signal that a logical component immediately follows. Steps 806-810 may then performed for each logical component. Specifically, a header for the next logical component may be identified at 806. The length of the next logical component may also be obtained from the header at 808. The next logical component (which may include data, a header and/or metadata) may then be split into a separate data stream at 810 using the length of the logical component. Alternatively, where the logical component does not have an associated header, the start of the next logical component may be identified by a particular sequential indicator (e.g., page number). For instance, a page number equal to zero may indicate the start of a new logical component. This process continues at 812 until the end of the file has been reached. As indicated above, the end of the file may be identified by an end of file tag or by the file length obtained from the metadata segment. Since the data stream may include data for multiple files, the process continues at 814 for each file until the process ends at 816. Upon completion of the separation process, the backup data stream has been subdivided into variable length segments of data bytes representing logical components of the database or file for which a data backup is being performed. All headers and associated metadata are passed through with the appropriate data stream.

Once a data stream is split into separate data streams corresponding to logical components, each separate data stream may be provided to a fixed position delta reduction backup application or may be further processed as described below with reference to FIGS. 9-12 to insert "padding" blocks before being provided to a fixed position delta reduction backup application. Since an inserted data block will only affect a single logical component, only a single data stream (associated with a single logical component) is affected. As a result, logical components in the backup data stream that are subsequent to the affected logical component will be processed separately by the fixed position delta reduction backup application, and therefore these logical components will not be "shifted" as a result of an inserted block in a previously processed logical component. Thus, while all subsequent logical components following a logical component including an inserted data block would, in a conventional approach, be detected as new data by a fixed position delta reduction application, only the affected logical component will be treated as new data by the fixed position delta reduction backup application.

As described above, a temporary "padding block" may be inserted where a missing data block is found in a data stream, which may correspond to a particular logical component if the data stream has been generated by a split of a larger backup stream into multiple data streams corresponding to logical components. As described above with reference to block 506 of FIG. 5, the insertion of such temporary data blocks will be described with reference to FIGS. 9-12.

Figure 9:
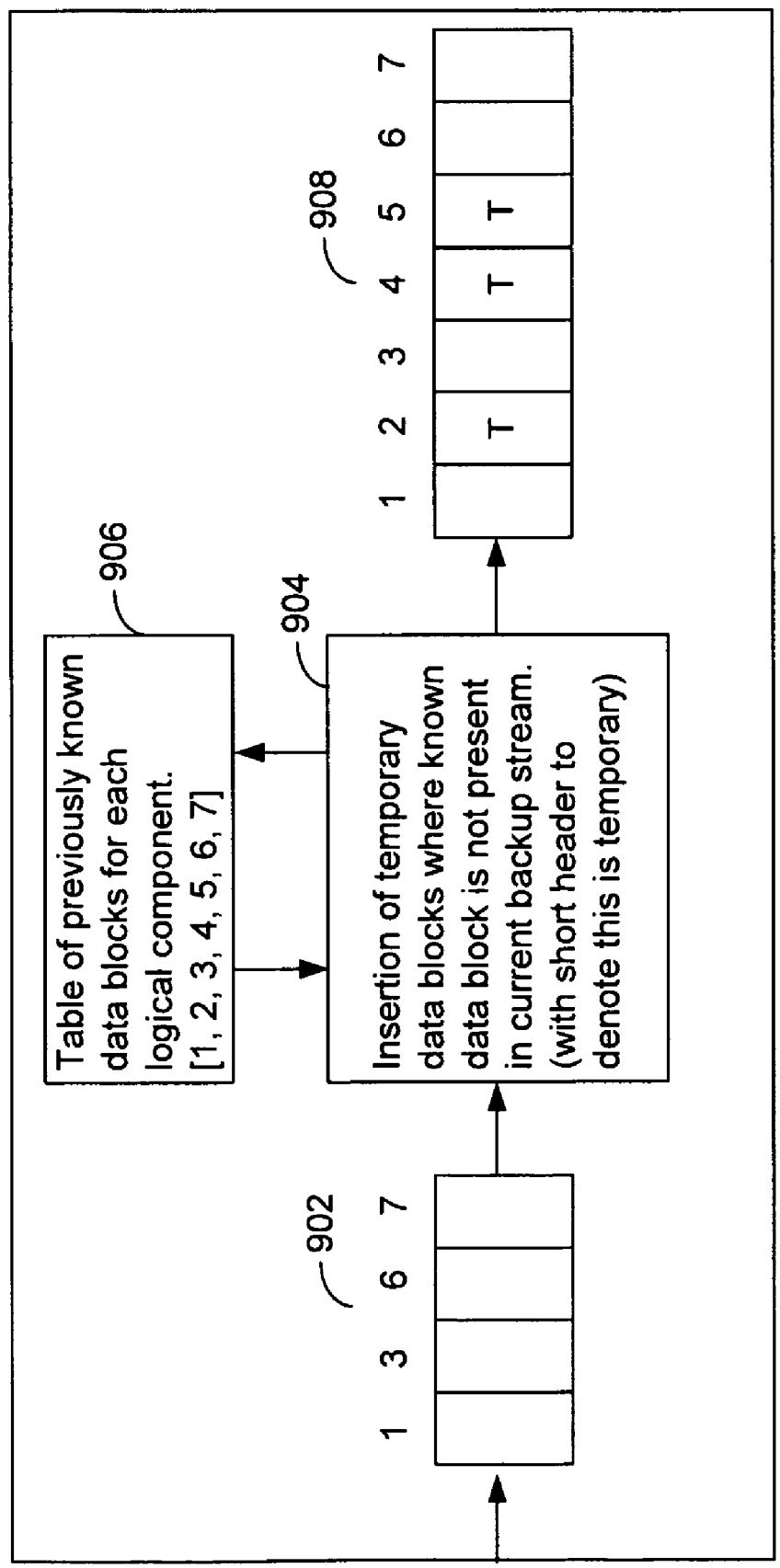
FIG. 9 is a block diagram illustrating an exemplary system for detecting missing data blocks and inserting a temporary data block where each missing data block is found as shown at block 506 of FIG. 5.

FIG. 9 is a block diagram illustrating an exemplary system for detecting missing data blocks and inserting a temporary data block where each missing data block is found as shown at block 506 of FIG. 5. In accordance with one embodiment, a data block that is "missing" from a data stream is a data block that has previously been assigned a sequential indicator. Thus, those sequential indicators that are missing from the sequence may identify missing data blocks. For instance, a "missing" data block may have been a data block that has been previously recorded (e.g., in association with the corresponding logical component) during a prior data backup, but detected as not present in the data stream (e.g., associated with the logical component). As shown in FIG. 9, a data stream 902 is received by delta method 904. In order to detect missing data blocks in the data stream 902 corresponding to a particular file or database, each data block that is encountered is identified and may be recorded as, e.g., a sequential identifier. From this recorded information, it is possible to compare data blocks present in the data stream 902 with the "sequence" or, alternatively, those recorded for a data stream that was processed during a previous backup (for the same file or database). Data blocks may be identified in a variety of ways. Sequential information for these data blocks indicating a sequential order of the data blocks with respect to the corresponding file (e.g., logical components) is also collected. In other words, from the sequential order, it may be inferred that specific data blocks are missing. Thus, this sequential information may be used to identify the data blocks, as well as ascertain the order and placement of the data blocks within a particular data stream.

In accordance with one embodiment, the delta method 904 identifies sequential information 906 for data blocks present in the data stream 902. This sequential information indicates the sequential order and placement of the data blocks within the data stream 902 (or corresponding logical component). For instance, the sequential information may include a sequential indicator retrieved from the content of each of the data blocks that indicates the specific placement of the corresponding data block within the data stream 902. A file page number is one example of sequential information that may be used for purposes of this invention.

From the sequential information 906 for data blocks present in the data stream 902, it is possible to identify those data blocks that are missing from the data stream 902. More particularly, it is possible to ascertain from the entire (explicit or implied) sequence of sequential indicators which sequential indicators from the sequence have not been identified in the data stream 902. Alternatively, it is also possible to compare the sequential information 906 with previously stored sequential information 906 for data blocks received in a previous data stream of backup data (e.g., corresponding to the same file or database).

Assuming that a larger backup data stream has been split into logical components, sequential information for data blocks present in each logical component may be analyzed to ascertain those data blocks that are missing from the logical component. In accordance with one embodiment, data blocks are counted from a specific identifier (e.g., block zero). For instance, if data blocks 1, 4, and 8 are identified as present, it becomes apparent that data blocks 2, 3, and 5-7 are missing. (It is irrelevant whether the last block(s) is missing, since padding need not be performed.) Alternatively, the sequential information for data blocks identified in the present data stream may be compared to previously stored sequential information for data blocks present in the same logical component in a backup data stream previously received for the same file or database (e.g., the same logical components).

Sequential information 906 may be stored in a table such as that described below with reference to FIG. 11, which may be used to identify a sequential indicator for each of the data blocks encountered during the current backup (or, alternatively, the last backup) performed for each logical component. In this manner, the sequential information 906 may be tracked (e.g., during the current backup).

As shown in this example, the data stream 902 includes data blocks identified by sequential indicators 1, 3, 6, and 7. When this sequential information is compared to the previously stored sequential information 906 associated with a previous backup identifying data blocks 1, 2, 3, 4, 5, 6, 7, missing data blocks 2, 4, and 5 are detected.

For each missing data block, a temporary "padding" data block "T" is inserted in place of the missing data block. An exemplary temporary "padding" block will be described in further detail with reference to FIG. 12. After a temporary data block "T" has been inserted in the same location as the detected missing data blocks 2, 4, and 5, the modified data stream 908 may be provided to a fixed position delta reduction backup application. Since temporary data blocks have been inserted where missing data blocks have been detected, there will be no "shift" in data. Accordingly, the fixed position delta reduction backup application will be able to correctly compare signatures of each of the fixed length data blocks with those signatures that have previously been stored by the fixed position delta reduction backup application for that particular file (or logical component).

Figure 10:
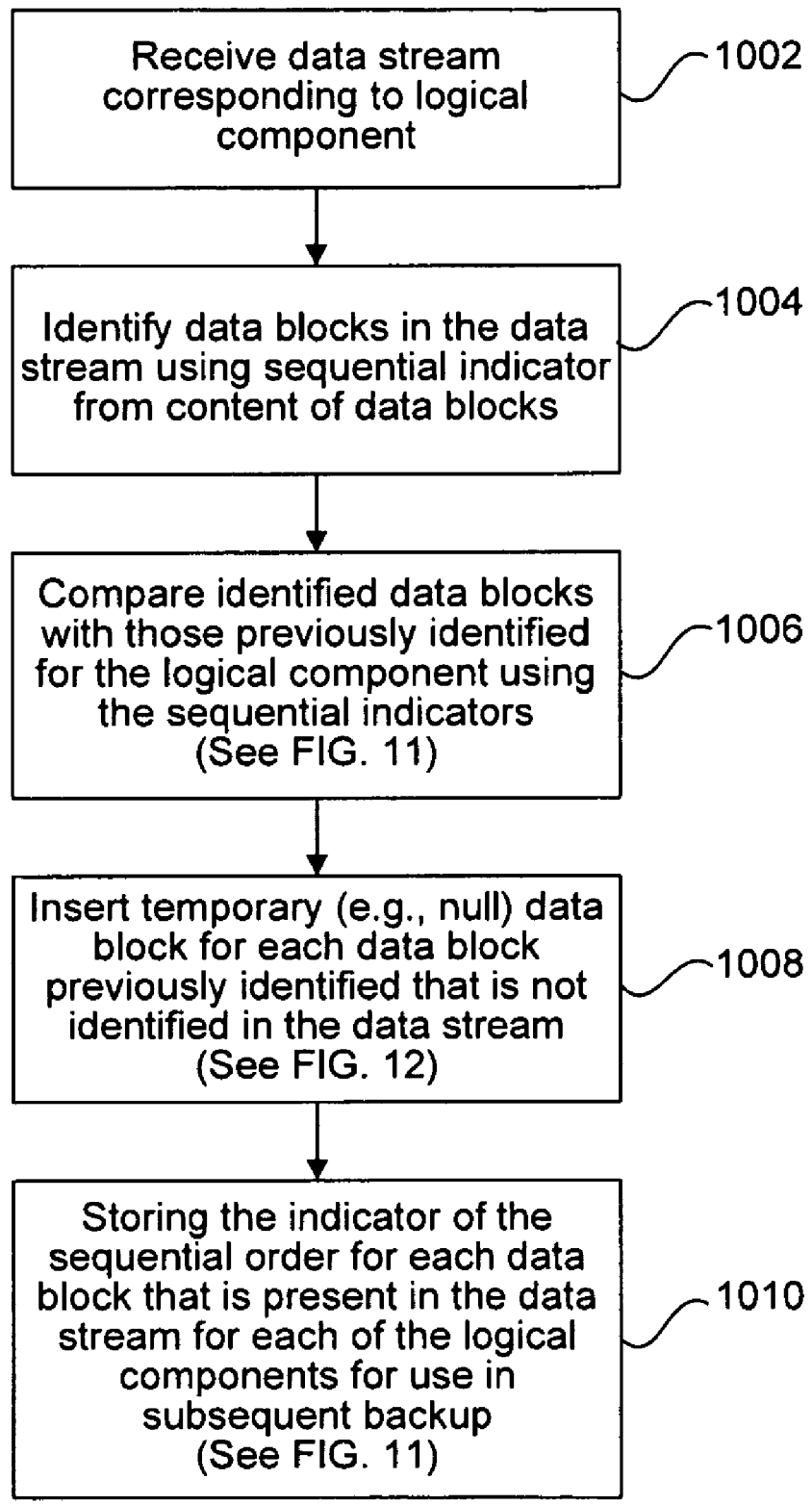
FIG. 10 is a process flow diagram illustrating a method of detecting missing data blocks and inserting temporary data blocks as shown at block 506 of FIG. 5 in accordance with one embodiment of the invention.

FIG. 10 is a process flow diagram illustrating a method of detecting missing data blocks and inserting temporary data blocks as shown at block 506 of FIG. 5 in accordance with one embodiment of the invention. As shown at 1002, a data stream is received. The data stream will correspond to a single logical component if a backup data stream has previously been separated into a plurality of data streams corresponding to logical components. As described above, data blocks in the data stream may be identified using a sequential indicator obtained from the content of each of the data blocks at 1004. For instance, the sequential indicator may be a numerical value or other sequential indicator. In accordance with one embodiment in which backup data is obtained from a SQL Server™ database, each page includes a page number, enabling the page numbers to be used to ascertain whether an extent is missing. In essence, the page number can serve as a sequential identifier in the case of data streams obtained from a SQL Server™ database.

Once the data blocks in the data stream have been identified, the identified data blocks may be compared with the consecutive sequence of sequential indicators to identify those data blocks that are missing. Alternatively, the identified data blocks may be compared with those that have been previously identified for the logical component using the corresponding sequential indicators at 1006. Specifically, the sequential indicators for the data blocks (e.g., extents) may be compared with those previously encountered for the logical component during a previous backup (e.g., the last backup performed for the logical component). This comparison may be achieved by accessing the sequential indicators that were recorded for the logical component (e.g., stored or updated) during the previous backup. An exemplary table that may be used to record the sequential indicators for data blocks that have been identified in each of the logical components during the most recent backup will be described in further detail below with reference to FIG. 11. A temporary (e.g., null) data block is then inserted for each data block that has been previously identified in a prior backup that is not identified in the data stream at 1008, resulting in a "padded" data stream.

More specifically, the temporary data block is inserted in the location in the data stream in which the "missing" data block has been detected. An exemplary temporary data block will be described in further detail below with reference to FIG. 12.

As set forth above, the identities of the data blocks that have been detected for each logical component during the current data backup may be temporarily recorded for use during the current backup (e.g., for comparison with a proper "sequence" of sequential indicators). Alternatively, the identities of the data blocks that have been detected for each logical component during the current data backup may be recorded for use in a subsequent data backup. Specifically, the sequential indicator for each data block that is present in the data stream may be recorded for each of the logical components at 1010. This recording process may be performed as each data block is processed. Recording may be accomplished by modifying or entirely replacing the sequential information that has been previously recorded for each logical component. The sequential indicators associated with each logical component may be stored or updated in a table such as that described below with reference to FIG. 1.

As described above, each data block in a data stream that is encountered may be identified and recorded. The identifying information may not only identify a data block within a particular data stream, but may also indicate a sequential order and placement of the data block within the data stream (or corresponding logical component). The sequential information indicating the order and placement of data blocks encountered during a backup for a particular data stream may be stored in a data structure such as a table.

Figure 11:
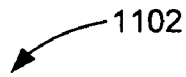
FIG. 11 is an exemplary table that may be used to store sequential information for data blocks encountered during a data backup as shown at block 906 of FIG. 9.

FIG. 11 is an exemplary table that may be used to store sequential information for data blocks encountered during a data backup as shown at block 906 of FIG. 9. In this example, the table 1102 identifies each logical component 1104 encountered for a particular file and data blocks 1106 encountered for the logical component 1104. Thus, logical components 1104 may be added to the table 1102 as new logical components 1104 are detected and logical components 1104 may be removed from the table 1102 as logical components 1104 are deleted or de-allocated. For instance, in this example, for logical component "1," data blocks 1-7 were encountered during the last backup for that file. Similarly, as shown, data blocks 1, 3, 4, and 5 were encountered during the last backup for logical component "2" of that file. In other words, data block 2 was deleted from logical component "2" prior to the last backup. Thus, if data block 2 is missing from logical component "2" in the subsequent backup, data block 2 will not be detected as a missing data block. Alternatively, the table 1102 may simply be used to track those data blocks that have been detected during the current backup for use solely during the current backup (e.g., for comparison with a "sequence" of sequential indicators). Such a table may be implemented using an array, linked list, or other suitable data structure.

If the data blocks are variable length data blocks rather than fixed length data blocks, it is desirable to record the length of each of the data blocks. Thus, the table 1102 may be modified accordingly. For instance, if the length of the data blocks varies with respect to position (e.g., the length of the data blocks is not identical), the length of each data block may be stored in the table or other suitable data structure. In this manner, the length of the data blocks may be used to ascertain whether a data block is missing at a particular position in the data stream. More specifically, the length of two or more consecutive data blocks in the backup data stream may be added to identify a particular location at which a particular data block should be found. For variable length data blocks for which the length varies over time (e.g., across data backups), it may be possible to identify the length of each data block during the current data backup from a header associated with each data block.

Figure 12:
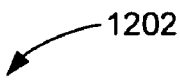
FIG. 12 is a diagram illustrating an exemplary temporary data block.

A temporary data block that is inserted where a missing data block has been detected may be implemented in a variety of formats. FIG. 12 is a diagram illustrating an exemplary temporary data block. Specifically, the temporary data block 1202 includes a header 1204 indicating that the data block is temporary. In this manner, the header 1204 denotes that the temporary data block 1202 is to be removed upon restore of the backup data. The payload 1206 of the temporary data block 1202 may include null (empty) bytes. For instance the payload 1206 may include all zeros. While it is possible to store temporary data other than null bytes in the payload 1206, the null bytes compress more efficiently by a backup application. The temporary data block 1202 may be the same fixed length as the other data blocks. In other words, the temporary data block 1202 includes a number of bytes equal in length to the "missing" data block. Thus, in accordance with one embodiment, the total bytes in the header 1204 and payload 1206 combined is the same length as the other fixed length data blocks.

As described above, once a data stream has been provided to a fixed position delta reduction backup application, the data stream is processed by the fixed position delta reduction backup application and the data that has been modified since the last backup is stored by the fixed position delta reduction backup application to local or remote storage. In some instances, it is necessary or desirable to restore the backup data that has previously been stored by the fixed position delta reduction backup application. When the fixed position delta reduction backup application retrieves the stored data, it is necessary to reverse the delta method that was previously performed to modify the backup data stream that was provided to the fixed position delta reduction backup application.

Figure 13:
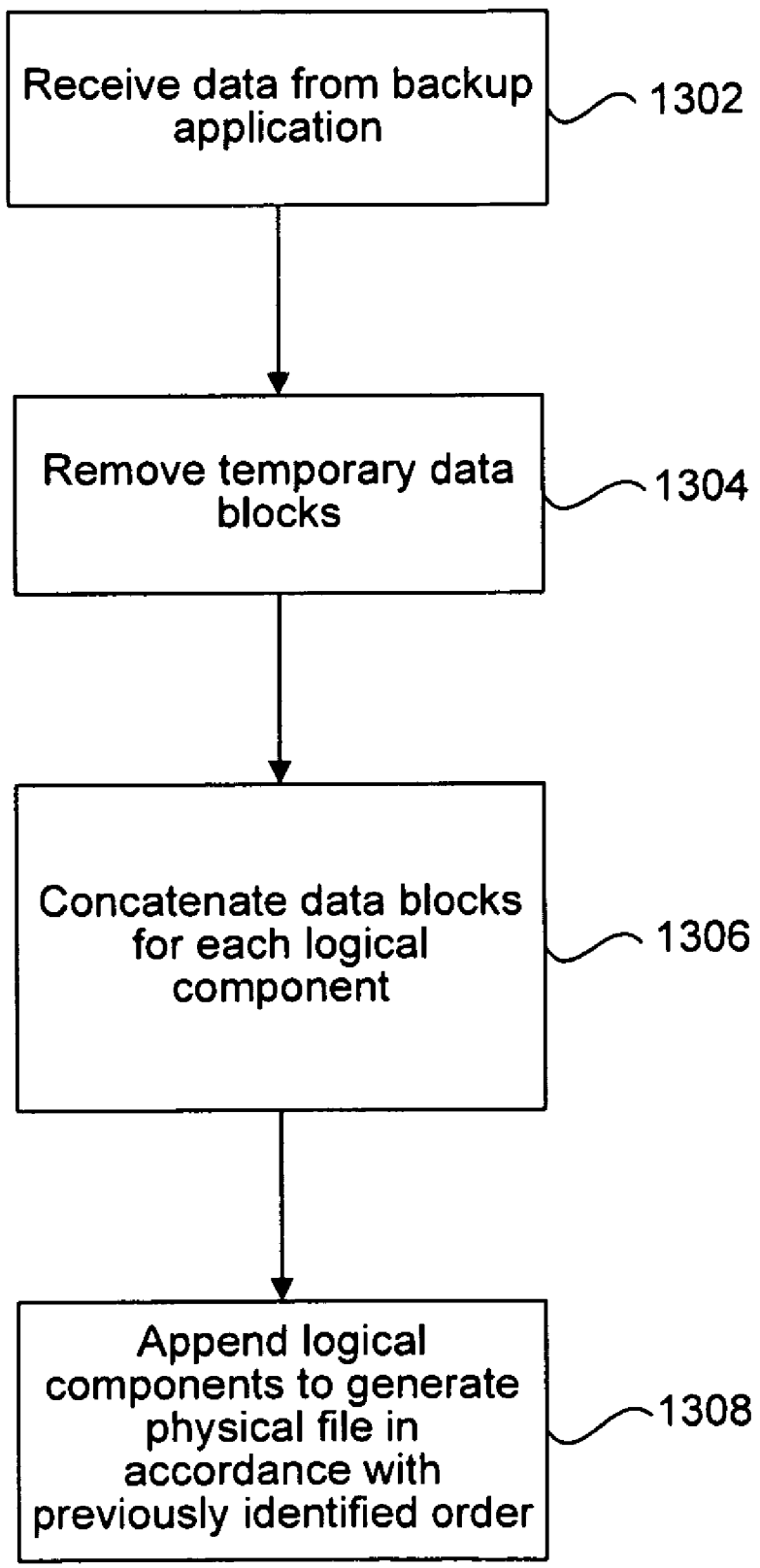
FIG. 13 is a process flow diagram illustrating a method of reversing the delta method previously performed upon restore of a file in accordance with one embodiment of the invention.

FIG. 13 is a process flow diagram illustrating a method of reversing the delta method previously performed upon restore of a file in accordance with one embodiment of the invention. As shown at 1302, data is received from a fixed position delta reduction backup application. This data may be received in the form of one or more data streams. Each temporary data block is removed from each of the data streams at 1304. As described above with reference to FIG. 12, a temporary data block may be identified and detected by the header of the temporary data block indicating that the temporary data block is to be removed upon restore of the backup data. The remaining data blocks in each of the data streams corresponding to the logical components are concatenated at 1306 after the temporary data blocks are removed for each logical component. The data streams corresponding to the separated logical components are then themselves concatenated in accordance with the previously identified order associated with the logical components at 1308. For instance, the order of the logical components within a particular file and associated data stream may be ascertained from a table such as that illustrated in FIG. 11. As another example, the logical components may be named and stored in a manner such that an order of the logical components is easily ascertained. For instance, logical components may be named "File1L1," "File1L2," "File1L3," etc, enabling the logical components to be automatically stored and retrieved in the correct order. In this manner, a physical file may be restored from the backup data that has been modified as set forth above.

Each file is restored in the format in which it was originally stored. In accordance with one embodiment, files are stored in a Microsoft Tape Format (MTF). However, files may be stored in a variety of formats. Moreover, databases will be restored in the format in which they have been maintained. For instance, files within a database will be restored in the file groups in which they were originally stored.

It is important to note that the file restore process operates to reverse the delta method previously performed to modify the backup data stream. As described above with reference to FIG. 5, two different processes may be performed on a backup data stream, which may be performed separately or in combination with one another. These two processes include the separation of logical components and the insertion of temporary data blocks for detected missing data blocks. The process illustrated in FIG. 13 corresponds to a system in which both of these processes have been performed to modify a backup data stream. However, the file restore process may also be performed to restore data for which only one of these processes has been performed to modify the backup data stream.

Generally, the techniques of the present invention may be implemented on software and/or hardware. In a specific embodiment of this invention, the technique of the present invention is implemented in software. Thus, the present invention relates to machine-readable media that include program instructions, state information (e.g., tables), etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in or associated with a tangible computer-readable medium in which a carrier wave travels over an appropriate medium such as airwaves, optical lines, electric lines, etc. Examples of program instructions include both machine code, such as produced by a compiler, and files containing higher level code that may be executed by a computer using an interpreter.

Figure 14:
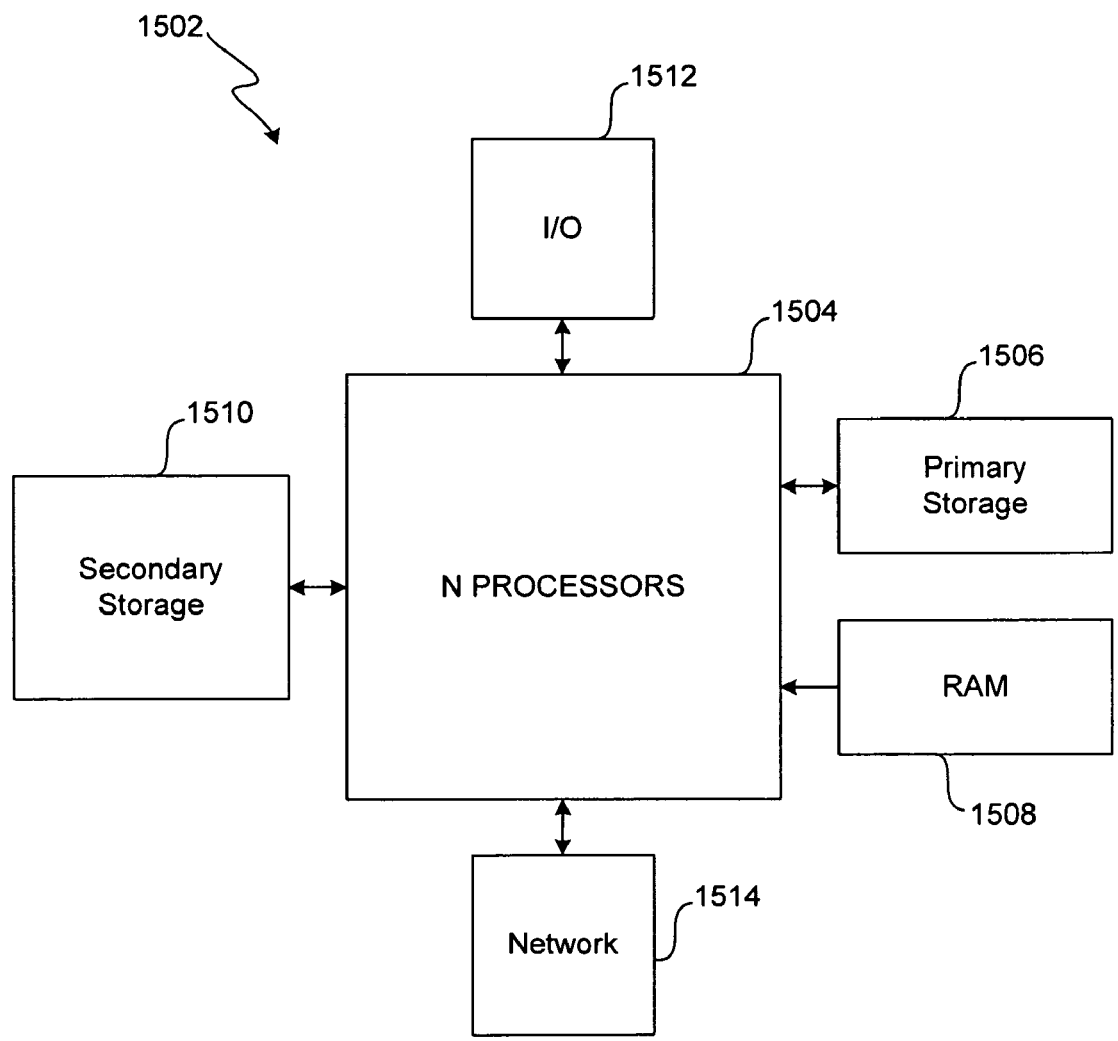
FIG. 14 is a block diagram illustrating a typical, general-purpose computer system suitable for implementing the present invention.

The present invention may be implemented on any suitable computer system. FIG. 14 illustrates a typical, general-purpose computer system 1502 suitable for implementing the present invention. The computer system may take any suitable form.

The computer system 1502 includes any number of processors 1504 (also referred to as central processing units, or CPUs) that may be coupled to memory devices including primary storage device 1506 (typically a read only memory, or ROM) and primary storage device 1508 (typically a random access memory, or RAM). As is well known in the art, ROM acts to transfer data and instructions uni-directionally to the CPUs 1504, while RAM is used typically to transfer data and instructions in a bi-directional manner. Both the primary storage devices 1506, 1508 may include any suitable computer-readable media.

A secondary storage medium 1510, which is typically a mass memory device, may also be coupled bi-directionally to CPUs 1504 and provides additional data storage capacity. The mass memory device 1510 is a computer-readable medium that may be used to store programs including computer code, data, and the like. Typically, the mass memory device 1510 is a storage medium such as a hard disk, which is generally slower than primary storage devices 1506, 1508. Alternatively, the mass memory device 1510 may be a storage device such as a SCSI storage device.

The CPUs 1504 optionally may be coupled to a computer or telecommunications network, e.g., an internet network or an intranet network, using a network connection as shown generally at 1514. With such a network connection, it is contemplated that the CPUs 1504 might receive information from the network (e.g., data associated with a restore process), or might output information to the network (e.g., data that has been processed by a fixed position delta reduction backup process or data that has been modified prior to being processed by a fixed position delta reduction backup application) in the course of performing the above-described method steps. Thus, backup data may be transmitted over a network to be processed, or to be stored to or retrieved from a remote storage device. For instance, the network may be a storage area network (SAN) such as a fibre-channel SAN. Accordingly, the invention may be installed for use across a network such as the Internet, thereby enabling data retrieval from and backup to disparate sources.

Although the foregoing invention has been described in some detail for purposes of clarity of understanding, it will be apparent that certain changes and modifications may be practiced within the scope of the appended claims. For instance, although the description refers to fixed length data blocks, the disclosed embodiments may be implemented in systems storing data in the form of variable length data blocks, where the length varies across position and/or time. Therefore, the described embodiments should be taken as illustrative and not restrictive, and the invention should not be limited to the details given herein but should be defined by the following claims and their full scope of equivalents.

What is claimed is:

1. A method of modifying a data stream of backup data to be provided to a fixed length fixed position delta reduction backup method, comprising:
   receiving the data stream;
   parsing the data stream into a plurality of logical components, at least one of the plurality of logical components including one or more data blocks;
   detecting missing data blocks in the plurality of logical components;
   inserting a temporary data block where each missing data block has been detected in each of the plurality of logical components, thereby generating one or more modified data streams; and
   providing the modified data streams to a fixed position delta reduction backup application;
   wherein the fixed position delta reduction backup application compares data blocks in the logical components of the modified data streams with data blocks of a previous version of the logical components;
   wherein the fixed position delta reduction backup application stores data blocks of the logical components of the modified data streams that are new or modified with respect to the corresponding data blocks of the previous version of the logical components.

2. The method as recited in claim 1, wherein each of the data blocks is a fixed length data block such that the length of each of the data blocks is identical.

3. The method as recited in claim 2, wherein the temporary data block is a fixed length data block having a length that is identical to the length of each of the data blocks.

4. The method as recited in claim 1, wherein each of the data blocks is a fixed length data block such that the length of each of the data blocks is fixed over time.

5. The method as recited in claim 1, further comprising:
   backing up the modified data streams using the fixed position delta reduction application by storing only the data blocks of the logical components of the modified data streams that are new or modified with respect to the corresponding data blocks of the previous version of the logical components.

6. The method as recited in claim 1, wherein each of the plurality of logical components is a logical component of a data file or database.

7. The method as recited in claim 6, wherein the database is a SQL database.

8. The method as recited in claim 1, wherein parsing the data stream into a plurality of logical components comprises:
   splitting the data stream into a plurality of data streams, each of the plurality of data streams corresponding to a different one of the plurality of logical components.

9. The method as recited in claim 8, wherein inserting a temporary data block for each missing data block that has been detected in the plurality of logical components comprises:
   inserting a temporary data block in the plurality of data streams for each missing data block that has been detected for the corresponding logical component.

10. The method as recited in claim 9, further comprising:
    removing each temporary data block from each of the plurality of data streams; and
    concatenating the plurality of data streams corresponding to the plurality of logical components.

11. The method as recited in claim 10, further comprising:
    concatenating remaining data blocks in each of the plurality of data streams.

12. The method as recited in claim 8, wherein detecting and inserting are performed for each of the plurality of data streams.

13. The method as recited in claim 1,
    wherein the delta reduction backup application stores only the data blocks are new or modified such that backup data stored in a previous backup session is updated.

14. The method as recited in claim 1, wherein detecting missing data blocks comprises:
    comparing sequential information for data blocks in each of the logical components in the data stream with previously stored sequential information for data blocks in each of the logical components in a previous data stream of backup data.

15. The method as recited in claim 1, wherein detecting missing data blocks comprises:
    identifying each data block corresponding to each of the logical components that has been identified as present in the data stream in a previously received data stream of backup data; and
    determining whether each identified data block is present in the data stream.

16. The method as recited in claim 1, wherein detecting missing data blocks comprises:
    identifying each data block corresponding to each of the logical components that has been identified as present in the data stream.

17. The method as recited in claim 16, wherein each data block is identified by an indicator of a sequential order of the data block among a plurality of data blocks within the corresponding one of the logical components.

18. The method as recited in claim 17, further comprising:
    detecting the missing data blocks using the indicators associated with the data blocks that have been identified as present in the data stream such that the missing data blocks have indicators of sequential order that are not present in the data stream.

19. The method as recited in claim 17, wherein the indicator of the sequential order of the data block among the plurality of data blocks within the corresponding one of the plurality of components further indicates a placement of the data block with respect to the plurality of data blocks within the corresponding one of the plurality of data blocks.

20. The method as recited in claim 17, further comprising:
obtaining the indicator of the sequential order of the data block among the plurality of data blocks from the data block.

21. The method as recited in claim 20, further comprising:
storing the indicator of the sequential order for each data block that is present in the data stream for each of the logical components.

22. The method as recited in claim 1, wherein parsing comprises:
identifying each of the plurality of logical components using a header corresponding to each of the plurality of logical components.

23. The method as recited in claim 1, wherein each data block is identified by an indicator of a sequential order of the data block among a plurality of data blocks within the corresponding one of the logical components, wherein parsing comprises:
identifying each of the plurality of logical components using the indicator of sequential order of the plurality of data blocks.

24. The method as recited in claim 1, wherein the temporary data block includes a header indicating that the temporary data block is to be removed during restore of the backup data.

25. The method as recited in claim 1, further comprising:
removing each temporary data block from each of the modified data streams; and
concatenating the modified data streams corresponding to the plurality of logical components.

26. The method as recited in claim 25, further comprising:
concatenating remaining data blocks in each of the modified data streams.

27. The method as recited in claim 25, further comprising:
obtaining the modified data streams from a fixed position delta reduction backup method.

28. The method as recited in claim 1, wherein each of the missing data blocks has been assigned a sequential identifier, wherein the sequential identifier of each of the missing data blocks is not present in the plurality of logical components.

29. The method as recited in claim 1, wherein each of the missing data blocks has been previously recorded during a previous backup, but is detected as not present in the plurality of logical components.

30. The method as recited in claim 1, wherein the temporary data block includes null bytes.

31. The method as recited in claim 1, wherein the temporary data block includes a header indicating that the temporary data block is temporary.

32. A method of modifying a data stream of backup data to be provided to a fixed length fixed position delta reduction backup method, comprising:
parsing the data stream into a plurality of logical components, at least one of the plurality of logical components including one or more data blocks, thereby generating one or more modified data streams;
detecting missing data blocks in the plurality of logical components;
inserting a temporary data block where each missing data block has been detected in the plurality of logical components, thereby generating one or more modified data streams; and
providing the modified data streams to a fixed position delta reduction backup application;
wherein the fixed position delta reduction backup application compares data blocks in the logical components of the modified data streams with data blocks of a previous version of the logical components;
wherein the fixed position delta reduction backup application stores data blocks of the logical components of the modified data streams that are new or modified with respect to the corresponding data blocks of the previous version of the logical components.

33. The method as recited in claim 32, wherein each of the data blocks is a fixed length, where the length of each of the data blocks is the same fixed length.

34. The method as recited in claim 32, wherein each of the data blocks is a fixed length data block such that the length of each of the data blocks is fixed over time.

35. The method as recited in claim 29, further comprising:
backing up the modified data streams using the fixed position delta reduction application by storing only the data blocks of the logical components of the modified data streams that are new or modified with respect to the corresponding data blocks of the previous version of the logical components.

36. The method as recited in claim 32, wherein each of the plurality of logical components is a logical component of a data file or database.

37. The method as recited in claim 36, wherein the database is a SQL database.

38. The method as recited in claim 32, wherein parsing the data stream into a plurality of logical components comprises:
splitting the data stream into a plurality of data streams, each of the plurality of data streams corresponding to a different one of the plurality of logical components.

39. The method as recited in claim 32, wherein parsing comprises:
identifying each of the plurality of logical components using a header corresponding to each of the plurality of logical components.

40. The method as recited in claim 32, wherein each data block is identified by an indicator of a sequential order of the data block among a plurality of data blocks within the corresponding one of the logical components, wherein parsing comprises:
identifying each of the plurality of logical components using the indicator of sequential order of the plurality of data blocks.

41. The method as recited in claim 32, wherein each of the missing data blocks has been assigned a sequential identifier in a sequence, wherein each sequential indicator that is missing from the sequence identifies one of the missing data blocks.

42. A method of modifying a data stream of backup data to be provided to a fixed length fixed position delta reduction backup method, the data stream of backup data corresponding to a data file or database, comprising:
detecting missing data blocks in the data stream; and
inserting a temporary data block in the data stream where each missing data block has been detected in the data stream, thereby generating one or more modified data streams; and
providing the modified data streams to a fixed position delta reduction backup application;
wherein the fixed position delta reduction backup application compares data blocks in the modified data streams with data blocks of a previous backup of the data file or database;

wherein the fixed position delta reduction backup application stores data blocks of the modified data streams that are new or modified with respect to the corresponding data blocks of the previous backup of the data file or database.

43. The method as recited in claim 42, wherein each data block in the data stream is a fixed length data block such that the length of each of the data blocks is identical.

44. The method as recited in claim 43, wherein the length of the temporary data block is identical to the length of each of the data blocks.

45. The method as recited in claim 42, wherein each data block in the data stream is a fixed length data block such that the length of each of the data blocks is fixed over time.

46. The method as recited in claim 42, further comprising: backing up the modified data streams using a fixed position delta reduction application by storing only the data blocks of the modified data streams that are new or modified with respect to the corresponding data blocks of the previous version of the data file or database.

47. The method as recited in claim 42, wherein the data stream corresponds to one or more logical components of the data file or database.

48. The method as recited in claim 42, wherein the database is a SQL database.

49. The method as recited in claim 47, wherein detecting missing data blocks comprises:
detecting missing data blocks for each of the logical components.

50. The method as recited in claim 47, wherein detecting missing data blocks comprises:
identifying each data block corresponding to each of the logical components that has been identified in a previously received data stream of backup data; and
determining whether each identified data block is present in the data stream.

51. The method as recited in claim 47, wherein detecting missing data blocks comprises:
identifying each data block corresponding to each of the logical components that has been identified as present in the data stream.

52. The method as recited in claim 51, wherein each data block is identified by an indicator of a sequential order of the data block among a plurality of data blocks within the corresponding one of the logical components.

53. The method as recited in claim 52, further comprising:
detecting the missing data blocks using the indicators associated with the data blocks that have been identified as present in the data stream such that the missing data blocks have indicators of sequential order that are not present in the data stream.

54. The method as recited in claim 52, further comprising:
obtaining the indicator of the sequential order of the data block among the plurality of data blocks from the data block.

55. The method as recited in claim 54, further comprising:
storing the indicator of the sequential order for each data block that is present in the data stream for each of the logical components.

56. The method as recited in claim 47, wherein detecting missing data blocks comprises:
detecting missing data blocks for each of the logical components that includes one or more data blocks.

57. The method as recited in claim 47, wherein inserting comprises:
inserting a temporary data block in the data stream for each missing data block that has been detected in the logical components of the data file or database.

58. The method as recited in claim 42, wherein detecting and inserting are performed for a plurality of data streams, each of the plurality of data streams corresponding to one of a plurality of logical components of the data file or database.

59. The method as recited in claim 42, wherein the temporary data block includes a header indicating that the temporary data block is to be removed during restore of the backup data.

60. A computer-readable medium storing thereon computer-readable instructions for modifying a data stream of backup data to be provided to a fixed length fixed position delta reduction backup method, comprising:
instructions for receiving the data stream;
instructions for parsing the data stream into a plurality of logical components, at least one of the plurality of logical components including one or more data blocks;
instructions for detecting missing data blocks in the plurality of logical components; and
instructions for inserting a temporary data block where each missing data block has been detected in each of the plurality of logical components, thereby generating one or more modified data streams; and
instructions for providing the modified data streams to a fixed position delta reduction backup application;
wherein the fixed position delta reduction backup application compares data blocks in the logical components of the modified data streams with data blocks of a previous version of the logical components;
wherein the fixed position delta reduction backup application stores data blocks of the logical components of the modified data streams that are new or modified with respect to the corresponding data blocks of the previous version of the logical components.

61. An apparatus for modifying a data stream of backup data to be provided to a fixed length fixed position delta reduction backup method, comprising:
a processor; and
a memory, at least one of the processor and the memory being adapted for:
receiving the data stream;
parsing the data stream into a plurality of logical components, at least one of the plurality of logical components including one or more data blocks;
detecting missing data blocks in the plurality of logical components; and
inserting a temporary data block where each missing data block has been detected in each of the plurality of logical components, thereby generating one or more modified data streams; and
providing the modified data streams to a fixed position delta reduction backup application;
wherein the fixed position delta reduction backup application compares data blocks in the logical components of the modified data streams with data blocks of a previous backup of the logical components;
wherein the fixed position delta reduction backup application stores data blocks of the logical components of the modified data streams that are new or modified with respect to the corresponding data blocks of the previous backup of the logical components.

* * * * *